United States Patent [19]

Taji

[11] Patent Number: 5,311,463
[45] Date of Patent: May 10, 1994

[54] SEMICONDUCTOR MEMORY DEVICE AND MANUFACTURING METHOD THEREOF

[75] Inventor: Satoru Taji, Sanda, Japan
[73] Assignee: Ricoh Company, Ltd., Tokyo, Japan
[21] Appl. No.: 3,499
[22] Filed: Jan. 12, 1993
[30] Foreign Application Priority Data Feb. 24, 1992 [JP] Japan .................. 4-073280

[51] Int. Cl.$^5$ .................................. G11C 13/00
[52] U.S. Cl. .................... 365/51; 365/182; 365/189.01
[58] Field of Search .......... 365/51, 189.01, 185, 365/230.01, 182

[56] References Cited

U.S. PATENT DOCUMENTS 4,694,428 9/1987 Matsomura et al. .......... 365/189.01

FOREIGN PATENT DOCUMENTS

| 59-148360 | 8/1984 | Japan | H01L 27/10 |
| 61-288464 | 12/1986 | Japan | H01L 27/10 |
| 63-81858 | 4/1988 | Japan | H01L 29/78 |
| 63-96953 | 4/1988 | Japan | H01L 27/10 |

Primary Examiner—Terrell W. Fears
Attorney, Agent, or Firm—Cooper & Dunham

[57] ABSTRACT

A semiconductor memory device has a diffusive region for a source formed in the shape of a band on a substrate; a diffusive region for a drain formed in the shape of a band in parallel with the diffusive region for a source and alternated with this diffusive region for a source; a first word line layer formed such that the first word line layer crosses the diffusive regions for a source and a drain; and a second word line layer formed in parallel with the first word line layer. The semiconductor memory device further has a channel region including an a-region on a substrate surface located on the lower side of a flat portion within a region prescribed between the diffusive regions for a source and a drain; and two b-regions on the substrate surface arranged on both sides of the a-region and located on the lower sides of first and second side wall portions.

3 Claims, 3 Drawing Sheets

SEMICONDUCTOR MEMORY DEVICE AND MANUFACTURING METHOD THEREOF

BACKGROUND OF THE INVENTION

1. Field of the Invention

The present invention relates to a semiconductor memory device and a method for manufacturing this semiconductor memory device. More particularly, the present invention relates to a MOS-type semiconductor memory device having a multivalued memory in a planar cell structure and a method for manufacturing this MOS-type semiconductor memory device.

2. Description of the Related Art

A memory cell structure of a mask ROM memory device used at present is constructed by one memory cell with respect to one bit. In this memory device, when a gate voltage of a memory cell transistor is set to a high potential, whether or not an electric current flows between a source and a drain of the memory cell transistor corresponds to value "1" or "0", or value "0" or "1", thereby reading data. There are various kinds of writing systems of ROM data such as a field system, a depression system, a core system and a contact system. In each of these systems, one bit corresponds to one memory cell.

Degree of integration in the semiconductor memory device is improved every year so that an area required for one memory cell is reduced. In the case of a mask ROM, an area for one memory transistor is reduced by reducing the area for a memory cell. A reduction in size of a memory cell has been tried by using a minimum design rule at any time.

One epoch-making method for reducing an area for a memory cell section is a method using a memory cell structure called a planar structure. For example, this method using the memory cell structure is shown in Japanese Patent Application Laying Open (KOKAI) Nos. 61-288464, 63-96953. The planar cell structure has a continuous diffusive region for a source region of plural MOS transistors, and a continuous diffusive region for a drain region of the plural MOS transistors. The continuous diffusive regions for the source and drain regions are alternately formed on a substrate in parallel with each other. A gate electrode is formed on the substrate such that the gate electrode crosses both the diffusive regions through an insulation film. In the planar cell structure, it is not necessary to dispose a field oxide film for separating constructional elements from each other and the plural transistors commonly have the source and drain regions. Accordingly, it is sufficient to dispose one contact portion between the source and drain regions with respect to several or several ten transistors, which is advantageous in the case of high integration.

However, one bit also corresponds to one memory cell in this planar cell structure.

In another method for reducing an area for a memory cell region, an amount of information per one memory cell is increased by setting the value of an electric current flowing out of one memory cell to three or more kinds of values. Japanese Patent Application Laying Open (KOKAI) No. 59-148360 and No. 63-81858 shows one method for setting this electric current value to three or more kinds of values. In this method, an effective channel width is set to three or more kinds of widths by core implantation into a channel region. For example, a multivalued memory in this proposed method uses a simple method in which a turning-on electric current between the source and the drain is controlled and set to four current values by using a core implantation system.

In the multivalued memory using the core implantation system, a value of the turning-on electric current is greatly dispersed by a shift in overlapping of a mask for the core implantation and a mask of a field oxide film. Therefore, no multivalued memory using the core implantation system is realized in a process for mass production.

SUMMARY OF THE INVENTION

It is therefore an object of the present invention to provide a semiconductor memory device and a manufacturing method thereof in which a four-valued ROM is formed by setting four kinds of turning-on electric currents on one memory cell by using a planar cell structure.

The above object of the present invention can be achieved by a semiconductor memory device comprising a diffusive region for a source formed in the shape of a band on a substrate to construct a source region of plural memory cells; a diffusive region for a drain formed in the shape of a band in parallel with the diffusive region for a source and alternated with this diffusive region for a source to construct a drain region of the plural memory cells; a first word line layer electrically insulated from the diffusive regions for a source and a drain and formed such that the first word line layer crosses the diffusive regions for a source and a drain; and a second word line layer electrically insulated from the diffusive regions for a source and a drain and the first word line layer and formed in parallel with the first word line layer.

The second word line layer includes a flat portion arranged between two first word line layers adjacent onto both sides of the second word line layer; a first side wall portion arranged on a side of one of the two adjacent first word line layers on both sides of the second word line layer and connected to one end of the flat portion and having a thickness substantially increased; a second side wall portion arranged on a side of the other of the two adjacent first word line layers on both sides of the second word line layer and connected to another end of the flat portion and having a thickness substantially increased; a first overlapping portion connected to the first side wall portion and extending onto an edge portion of one of the two first word line layers such that the first overlapping portion overlaps this edge portion; and a second overlapping portion connected to the second side wall portion and extending onto an edge portion of the other of the two first word line layers such that the second overlapping portion overlaps this edge portion.

The semiconductor memory device further comprises a channel region including an a-region on a substrate surface located on a lower side of the flat portion within a region prescribed between the diffusive regions for a source and a drain; and two b-regions on the substrate surface arranged on both sides of the a-region and located on lower sides of the first and second side wall portions. The channel region is formed to provide four states of electric current values with respect to each of the memory cells. The four states are composed of a first state in which there is no core implantation in each of the a-region and the two b-regions; a second state in which there is core implantation only in the a-region; a third state in which there is core implantation only in the two b-regions; and a fourth state in which there is core implantation in all of the a-region and the two b-regions.

In accordance with the above structure, the present invention provides a four-valued memory having the four states of electric current values with respect to one memory cell. Accordingly, a degree of integration of a ROM having a general planar cell structure can be doubled.

In the present invention, the core implantation for forming the four states in the channel region is set in a self-aligning process with the two word line layers as masks. Accordingly, there is no problem about a shift in overlapping of the masks. Therefore, it is possible to realize a multivalued memory in which dispersion in turning-on electric current is reduced.

Further, It is easy to read information by a sensing amplifier by setting a width of the a-region to be equal to that of each of the b-regions in each of the memory cells.

An operating speed of the semiconductor memory device can be increased by constructing at least the second word line layer as a polycide structure.

The above object of the present invention can be also achieved by a manufacturing method of a semiconductor memory device comprising the steps of a process for forming diffusive regions for a source and a drain in the shape of a band in parallel with each other on a substrate; a process for forming a first word line layer electrically insulated from the diffusive regions for a source and a drain and crossing the diffusive regions for a source and a drain; and a process for forming a second word line layer electrically insulated from the diffusive regions for a source and a drain and the first word line layer and parallel to the first word line layer.

The second word line layer includes a flat portion arranged between two first word line layers adjacent onto both sides of the second word line layer; a first side wall portion arranged on a side of one of the two adjacent first word line layers on both sides of the second word line layer and connected to one end of the flat portion and having a thickness substantially increased; a second side wall portion arranged on a side of the other of the two adjacent first word line layers on both sides of the second word line layer and connected to another end of the flat portion and having a thickness substantially increased; a first overlapping portion connected to the first side wall portion and extending onto an edge portion of one of the two first word line layers such that the first overlapping portion overlaps this edge portion; and a second overlapping portion connected to the second side wall portion and extending onto an edge portion of the other of the two first word line layers such that the second overlapping portion overlaps this edge portion.

The manufacturing method uses three regions composed of an a-region on a substrate surface located on a lower side of the flat portion within a region prescribed between the diffusive regions for a source and a drain; and two b-regions on the substrate surface arranged on both sides of the a-region and located on lower sides of the first and second side wall portions.

The manufacturing method further comprises the step of a process for forming four states composed of a first state in which there is no core implantation in each of the a-region and the two b-regions; a second state in which there is core implantation only in the a-region; a third state in which there is core implantation only in the two b-regions; and a fourth state in which there is core implantation in all of the a-region and the two b-regions.

The four states are formed by ion implantations composed of ion implantation with low energy set such that ions reach the substrate surface in the a-region and do not reach the substrate surface in the b-regions; and ion implantation with high energy set such that the ions reach a deep portion of the substrate through the substrate surface in the a-region and reach the substrate surface in the b-regions. The ions are implanted into the substrate having an opening portion formed on a predetermined memory cell by using a resist pattern with respect to each of the ion implantations with low and high energies.

The manufacturing method of the present invention provides a four-valued memory having the four states of electric current values with respect to one memory cell. Accordingly, a degree of integration of a ROM having a general planar cell structure can be doubled.

In the manufacturing method of the present invention, the core implantation for forming the four states in the channel region is set in a self-aligning process with the two word line layers as masks. Accordingly, there is no problem about a shift in overlapping of the masks. Therefore, it is possible to realize a multivalued memory in which dispersion in turning-on electric current is reduced.

Further objects and advantages of the present invention will be apparent from the following description of the preferred embodiments of the present invention as illustrated in the accompanying drawings.

BRIEF DESCRIPTION OF THE DRAWINGS

FIG. 1b is a cross-sectional view of the four-valued memory cell taken along line 1—1 of FIG. 1a;

FIG. 1c is a cross-sectional view of the four-valued memory cell taken along line 3—3 of FIG. 1a;

DESCRIPTION OF THE PREFERRED EMBODIMENTS

The preferred embodiments of a semiconductor memory device and a manufacturing method thereof in the present invention will next be described in detail with reference to the accompanying drawings.

In the present invention, four kinds of channel widths are realized by self-aligning core implantation into a channel of a memory cell.

Figure 1A:
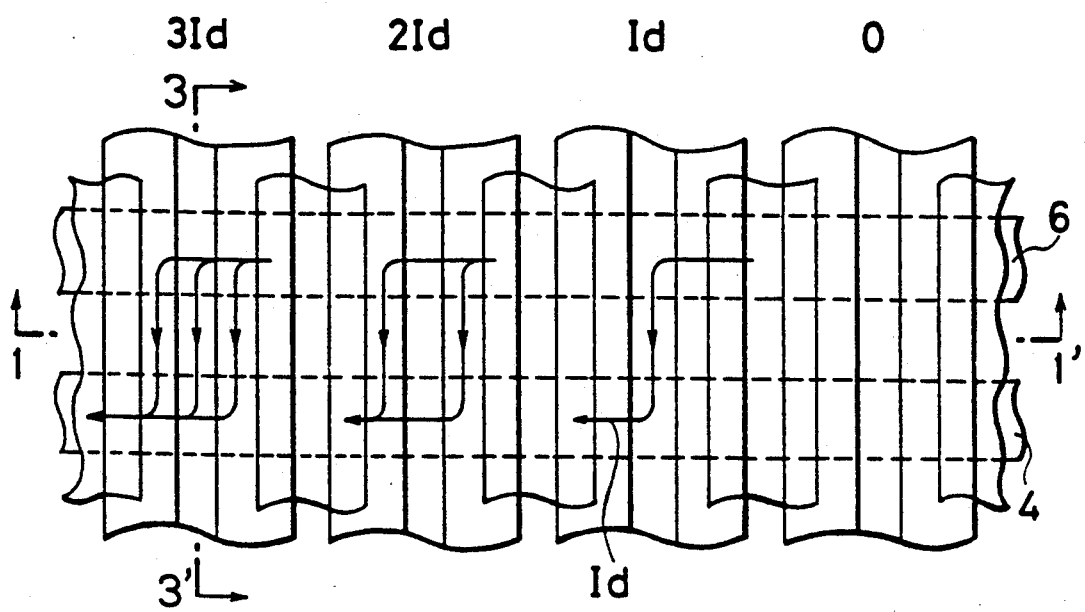
FIG. 1a is a plan view showing a four-valued memory cell in accordance with one embodiment of the present invention.
Figure 1B:
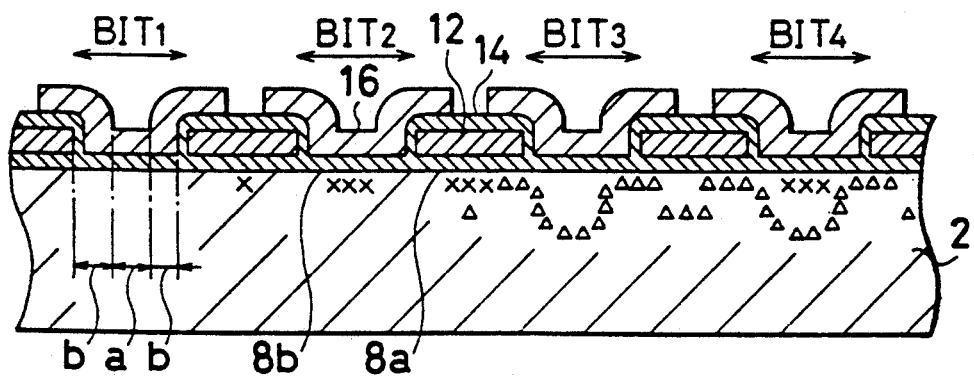
Figure 1C:
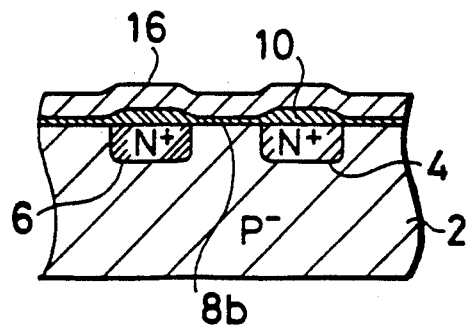

FIGS. 1a to 1c show a four-valued memory cell in accordance with one embodiment of the present invention. FIG. 1a is a plan view of the four-valued memory cell. FIG. 1b is a cross-sectional view of the four-valued memory cell taken along line 1—1 of FIG. 1a. FIG. 1c is a cross-sectional view of the four-valued memory cell taken along line 3—3 of FIG. 1a.

The four-valued memory cell has a continuous N-type diffusive region 4 for a source region of plural memory cells and a continuous N-type diffusive region 6 for a drain region of the plural memory cells. The continuous N-type diffusive regions 4 and 6 are alternately formed on a P-type silicon substrate 2 in parallel with each other. The diffusive region 6 for the drain region is electrically connected to a sensing circuit, thereby forming a bit line. The diffusive region 4 for the source region forms a ground line. Gate oxide films 8a and 8b are formed on a substrate surface between the diffusive regions 4 and 6. A silicon oxide film 10 is formed on the diffusive regions 4 and 6 and is set to be thicker than each of the gate oxide films 8a and 8b. A first word line layer 12 is formed on the substrate through the gate oxide film 8a and the silicon oxide film 10 in a direction perpendicular to the diffusive regions 4 and 6. A silicon oxide film 14 is formed on a surface of the first word line layer 12. A second word line layer 16 is formed on the substrate 2 through the gate oxide film 8b and the silicon oxide film 10. This second word line layer 16 is also formed on the first word line layer 12 through the silicon oxide film 14 such that the second word line layer 16 is parallel to the first word line layer 12 and partially overlaps the first word line layer 12 adjacent to the second word line layer 16 on each of both sides thereof. A layer insulation film is formed between the first and second word line layers and contact holes are formed in predetermined positions so that respective constructional portions are connected to each other by metallic wiring on this layer insulation film. The layer insulation film, the contact holes, etc. are omitted in FIG. 1.

A channel region of each of the memory cells is constructed by a substrate surface on a lower side of the second word line layer 14 between the diffusive regions 4 and 6 and between the first word line layers 12 and 12. The channel region is constructed by three regions composed of one a-region and two b-regions. In the a-region, the second word line layer 16 is flat. In each of the two b-regions, the second word line layer 16 is formed in the shape of a side wall on both sides thereof so that both the sides of the second word line layer 16 are substantially thicker. Ions are implanted into a memory cell to write information to this memory cell. In FIG. 1b, BIT1 shows a first state in which there is no core implantation in each of the a-region and the two b-regions. BIT2 shows a second state in which there is core implantation only in the a-region. BIT3 shows a third state in which there is core implantation only in the two b-regions (ions are implanted into a deep portion of the substrate 2 in the a-region). BIT4 shows a fourth state in which there is core implantation in all of the a-region and the two b-regions.

For example, each of the gate oxide films 8a and 8b has a thickness about 150 Å. Each of the silicon oxide films 10 and 14 has a thickness from 1000 to 2000 Å. Each of the word line layers 12 and 16 has a thickness from 2000 to 4000 Å. Each of these films is constructed by a polycrystal silicon film having a resistance reduced by impurity diffusion.

Mark "x" in FIG. 1b shows a boron ion implanted with low energy such as 80 KeV. An amount of this implanted boron ion is set to about $1 \times 10^{13}/cm^2$. Mark "Δ" in FIG. 1b shows a boron ion implanted with high energy such as 200 KeV. An amount of this implanted boron ion is set to about $1 \times 10^{13}/cm^2$. In the a-region, the boron ion reaches a substrate surface by the ion implantation with low energy. In the b-regions, no boron ion reaches the substrate 2 by the ion implantation with low energy. In the a-region, the boron ion passes through the substrate surface by the ion implantation with high energy and further reaches a deep portion of the substrate 2. In the b-regions, the boron ion is implanted onto the substrate surface by the ion implantation with high energy. A threshold voltage of a channel region having the boron ion implanted onto the substrate surface is higher than a gate voltage having a high voltage such as 5 volts at an operating time of the memory cell so that no channel is formed. In contrast to this, in a channel region having the boron ion implanted into the deep portion of the substrate, a channel is formed with high gate voltage and is similar to a channel formed in a case in which no ion is implanted. Each of the channel regions is constructed by three regions composed of a central a-region and two b-regions on both sides of the central a-region. Four kinds of implanting states are obtained in accordance with implantation or non-implantation of the boron ion on the substrate surface in each of the three regions a and b. In the state of BIT1, there is no core implantation in each of three regions so that a channel is formed in each of the three regions a and b when the second word line layer 16 is set to have a high voltage. Accordingly, a drain electric current flows through this channel. In the state of BIT2, no channel is formed in the a-region so that no drain electric current flows through the a-region. A channel is formed in each of the two b-regions so that a drain electric current flows through this channel. In the state of BIT3, a channel is formed in the a-region so that a drain electric current flows through this channel. No channel is formed in each of the two b-regions so that no drain electric current flows through the two b-regions. In the state of BIT4, no channel is formed in each of the a-region and the b-regions so that no drain electric current flows through the a-region and the b-regions. The above results are summarized in the following Table 1.

TABLE 1

|   | BIT 1 | BIT 2 | BIT 3 | BIT 4 |
|---|---|---|---|---|
| b |   |   | Δ | Δ |
| a |   | x | (Δ) | x |
|   |   |   |   | (Δ) |
| b |   |   | Δ | Δ |

In the above Table 1, marks x and Δ show that core implantation is performed and no drain electric current flows even when the second word line layer 16 has a high voltage. Mark (Δ) shows that ions are implanted into a deep portion of the substrate and no flow of the drain electric current is prevented by this ion implantation.

In the embodiment shown in FIG. 1, when information is read out of a memory cell, the voltage of the first word line layer 12 is set to a ground voltage level and no channel is formed on a substrate surface below the first word line layer 12 so as to separate memory cells from each other. A predetermined memory cell is selected by setting the voltage of the second word line layer 16 to a high voltage. A sensing amplifier detects the value of an electric current flowing through a channel of this selected memory cell, thereby reading the information. For example, widths of the a-region and the b-regions are equally set to 0.2 μm and a turning-on electric current per 0.2 μm is set to 70 μA. In this case, entire turning-on electric currents of each of the memory cells with respect to BIT1, BIT2, BIT3 and BIT4 are respectively set to 210 μA, 140 μA, 70 μA and 0 μA, thereby realizing a four-valued memory.

When the widths of the a-region and the b-regions are set to be equal to each other, differences between the turning-on electric current values in the states of BIT1, BIT2, BIT3 and BIT4 are equal to each other and can be maximized. Further, a reading margin of the sensing amplifier can be most widened.

Each of the word line layers 12 and 16 may have a polycide structure to operate the semiconductor memory device of the present invention at a high speed. In particular, it is preferable to provide the polycide structure for the second word line layer 16. For example, the polycide structure is provided by laminating a silicide film made of tungsten and having a thickness about 2000 Å on a polycrystal silicon film having a thickness from 1500 to 2000 Å. This polycide structure can be formed by a CVD method or a sputtering method. In the polycide structure, a different metallic silicide film having a high melting point may be used instead of the tungsten silicide film.

A method for manufacturing the semiconductor memory device in this embodiment will next be explained with reference to FIGS. 2 and 3.

Figure 2A:
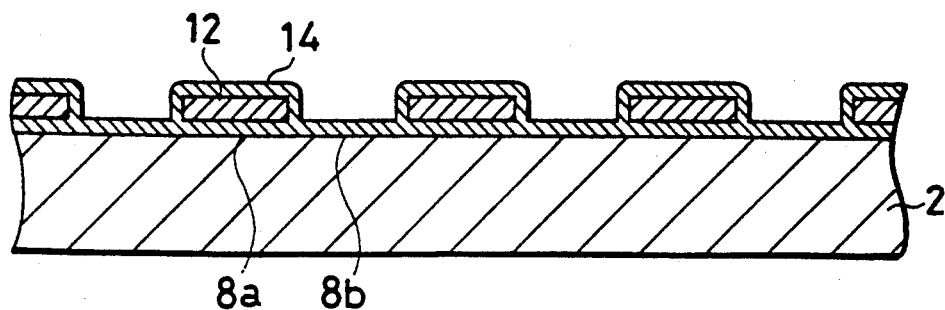
FIGS. 2a to 2d are cross-sectional views showing manufacturing processes of the memory cell in accordance with one embodiment of a manufacturing method of a semiconductor memory device in the present invention.
Figure 3:
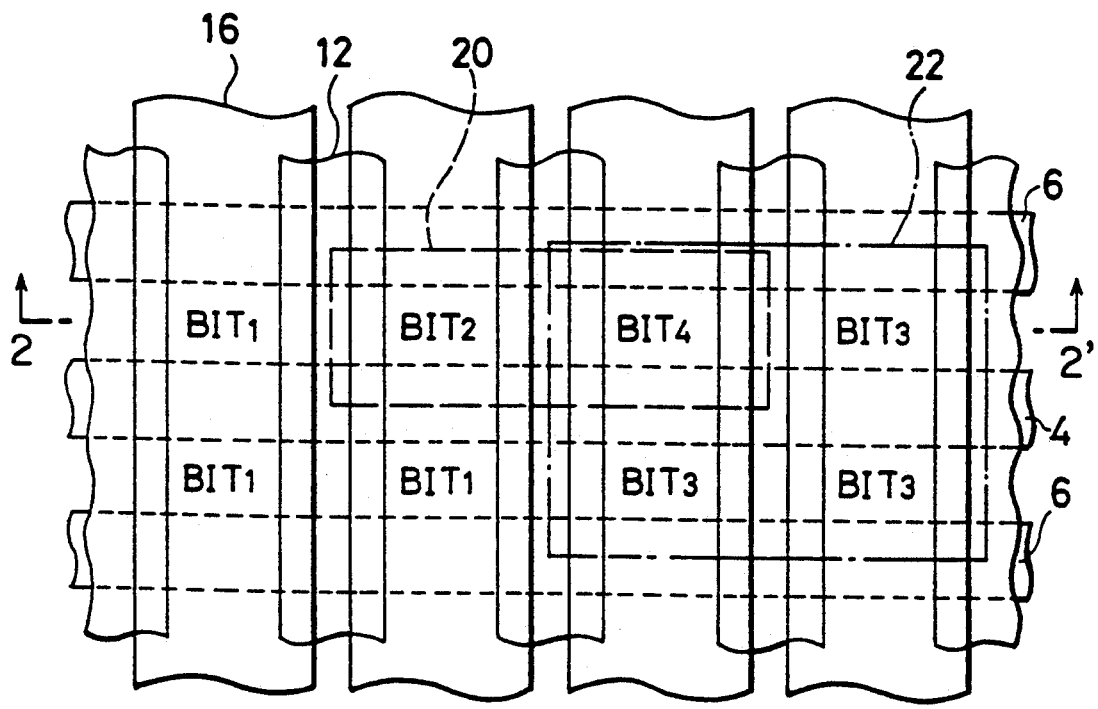
FIG. 3 is a plan view showing a core implanting region during the manufacturing processes.

(A) As shown in FIG. 2a, resist patterns are formed by photolithography on a surface of a P-type silicon substrate 2. The resist patterns are disposed to form diffusive regions 4 and 6 for source and drain regions parallel to each other and formed in the shape of a band. Ions of phosphorus or arsenic are implanted into the substrate 2 with the resist patterns as masks. Thus, the source region is formed as a ground line and the drain region is formed as a bit line. Thereafter, the resist patterns are removed from the substrate and the substrate surface is oxidized. Thus, a gate oxide film 8a is formed on the substrate surface between diffusive layers. A silicon oxide film is formed on the diffusive layers and is set to be thicker than each of the diffusive layers.

A polycrystal silicon film having a reduced resistance is deposited on the substrate such that this polycrystal silicon film has a thickness from 2000 to 4000 Å. The polycrystal silicon film is then patterned by photolithography and etching. Thus, a first word line layer 12 is formed in the shape of a band in a direction perpendicular to the diffusive regions 4 and 6.

The gate oxide film 8a is removed from the substrate between adjacent first word line layers 12. Thereafter, a silicon oxide film is formed by thermal oxidation as a layer insulation film on a surface of each of the first word line layers 12. Simultaneously, a gate oxide film 8b is grown on the substrate exposed between the adjacent first word line layers 12 such that the gate oxide film 8b has the same thickness as the gate oxide film 8a.

Figure 2B:
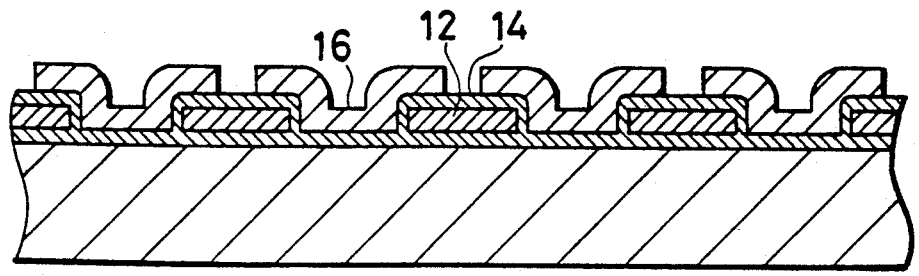

(B) As shown in FIG. 2b, a polycrystal silicon film as a second layer having a reduced resistance is deposited such that this polycrystal silicon film has a thickness from 2000 to 4000 Å. This polycrystal silicon film is then patterned by photolithography and etching. Thus, a second word line layer 16 is formed in parallel with each of the first word line layers 12 and is formed on each of the first word line layers 12 such that the second word line layer 16 partially overlaps the adjacent first word line layers 12 on both sides thereof.

Figure 2C:
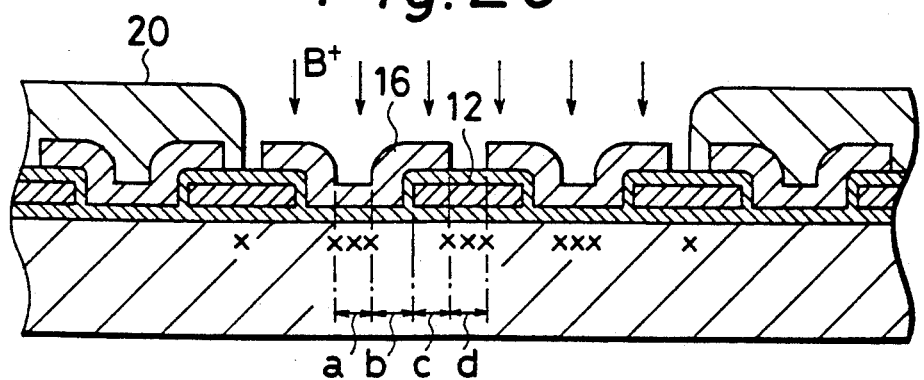

(C) As shown in FIG. 2c, a resist pattern 20 having an opening portion is formed on a predetermined memory cell to perform core implantation in a channel region. Then, boron ions are implanted into the substrate with low energy. The opening portion of the resist pattern 20 is surrounded by a broken line in FIG. 3. Energy of ion implantation is set to about 80 KeV and an amount of the implanted boron ions is set to about $1 \times 10^{13}/cm^2$. At this time, the boron ions are implanted onto the substrate surface in a flat a-region of the second word line layer 16 between the adjacent first word line layers 12. No boron ions are implanted into b-regions on both sides of the a-region. In the b-regions, the second word line layer 16 is formed in the shape of a side wall so that the second word line layer 16 is substantially set to be thicker. No boron ions are also implanted into a c-region in which the first word line layer 12 partially overlaps the second word line layer 16. The boron ions are implanted onto the substrate surface in a d-region in which there is no second word line layer 16. In FIG. 2c, the boron ions implanted with low energy are shown by marks "x".

Figure 2D:
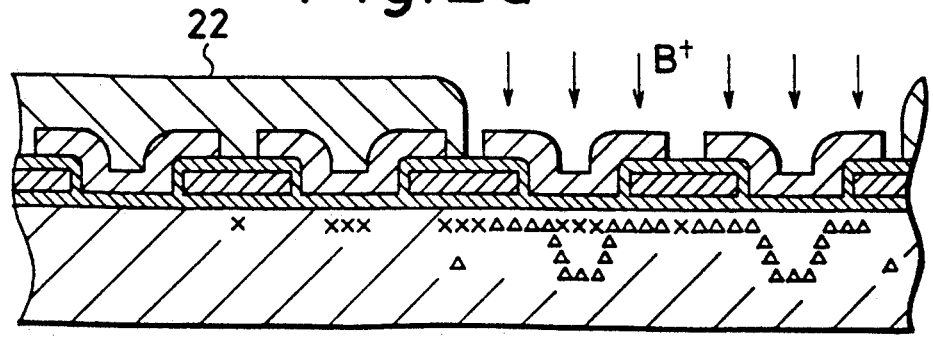

(D) As shown in FIG. 2d, after the resist pattern is removed from the substrate, a resist pattern 22 is again formed by photolithography. In this case, boron ions are implanted into the substrate with high energy such as 200 KeV. An amount of the implanted boron ions is set to about $1 \times 10^{13}/cm^2$. An opening portion of the resist pattern 22 is surrounded by a one-dotted chain line in FIG. 3. At this time, the boron ions reach a deep position of the substrate in the a-region and the d-region and are implanted onto the substrate surface in the b-region and the c-region. The boron ions implanted with high energy are shown by marks Δ.

An implanting state of each of the memory cells is set to one of BIT1, BIT2, BIT3 and BIT4 by the above two ion implantations.

Thereafter, a layer insulation film, contact holes, metallic wirings, a passivation film and a bonding pad are sequentially formed in accordance with normal manufacturing processes so that the semiconductor memory device is completely formed.

In the above manufacturing method, a gate oxide film 8a may be formed before the ion implantation for forming the diffusive regions for the source and drain regions.

In the above embodiment, only memory portions are shown, but peripheral circuits are generally formed on the same chip. The peripheral circuits may be formed in accordance with normal manufacturing processes.

Many widely different embodiments of the present invention may be constructed without departing from the spirit and scope of the present invention. It should be understood that the present invention is not limited to the specific embodiments described in the specification, except as defined in the appended claims.

What is claimed is:
1. A semiconductor memory device comprising:
  a diffusive region for a source formed in the shape of a band on a substrate to construct a source region of plural memory cells;
  a diffusive region for a drain formed in the shape of a band in parallel with said diffusive region for a source and alternated with this diffusive region for a source to construct a drain region of the plural memory cells;
  a first word line layer electrically insulated from said diffusive regions for a source and a drain and formed such that the first word line layer crosses the diffusive regions for a source and a drain; and a second word line layer electrically insulated from said diffusive regions for a source and a drain and said first word line layer and formed in parallel with the first word line layer;

the second word line layer including:

a flat portion arranged between two first word line layers adjacent onto both sides of said second word line layer;

a first side wall portion arranged on a side of one of said two adjacent first word line layers on both sides of said second word line layer and connected to one end of said flat portion and having a thickness substantially increased;

a second side wall portion arranged on a side of the other of said two adjacent first word line layers on both sides of said second word line layer and connected to another end of said flat portion and having a thickness substantially increased;

a first overlapping portion connected to said first side wall portion and extending onto an edge portion of one of said two first word line layers such that the first overlapping portion overlaps this edge portion; and a second overlapping portion connected to said second side wall portion and extending onto an edge portion of the other of said two first word line layers such that the second overlapping portion overlaps this edge portion;

the semiconductor memory device further comprising a channel region including:

an a-region on a substrate surface located on a lower side of said flat portion within a region prescribed between said diffusive regions for a source and a drain; and two b-regions on the substrate surface arranged on both sides of the a-region and located on lower sides of said first and second side wall portions;

the channel region being formed to provide four states of electric current values with respect to each of the memory cells; and the four states being composed of:

a first state in which there is no core implantation in each of said a-region and said two b-regions;

a second state in which there is core implantation only in said a-region;

a third state in which there is core implantation only in said two b-regions; and a fourth state in which there is core implantation in all of said a-region and said two b-regions.

2. A semiconductor memory device as claimed in claim 1, wherein a width of the a-region is equal to that of each of the b-regions.

3. A semiconductor memory device as claimed in claim 1, wherein at least the second word line layer of the first and second word line layers has a polycide structure.

* * * * *